(12) United States Patent
Chiu et al.

(10) Patent No.: US 9,029,831 B2
(45) Date of Patent: May 12, 2015

(54) LIGHT EMITTING DIODE AND METHOD FOR MANUFACTURING LIGHT EMITTING DIODES

(71) Applicant: Advanced Optoelectronic Technology, Inc., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 14/083,362

(22) Filed: Nov. 18, 2013

(65) Prior Publication Data

US 2014/0306176 A1  Oct. 16, 2014

(30) Foreign Application Priority Data

Apr. 15, 2013 (CN) .......................... 2013 1 0128027

(51) Int. Cl.
*H01L 29/06* (2006.01)
*H01L 31/00* (2006.01)
*H01L 33/06* (2010.01)
*H01L 33/60* (2010.01)
*H01L 33/00* (2010.01)
*H01L 33/10* (2010.01)

(52) U.S. Cl.
CPC ................ *H01L 33/06* (2013.01); *H01L 33/60* (2013.01); *H01L 33/007* (2013.01); *H01L 33/10* (2013.01)

(58) Field of Classification Search
CPC ........ B82Y 20/00; H01L 33/32; H01L 33/06; H01L 33/007; H01L 33/08; H01L 33/20; H01L 33/10; H01L 2251/5315; H01L 27/3244; H01L 33/105; H01L 33/465; H01L 33/46; H01L 29/2003; H01L 31/105; H01L 21/0254; G02F 1/133603; H01S 5/423
USPC ............ 257/13, 615, 189, 200–201, E51.021, 257/E33.069, E33.049, E31.019, E31.026; 438/FOR. 157, FOR. 287, FOR. 256, 438/FOR. 267

See application file for complete search history.

(56) References Cited

U.S. PATENT DOCUMENTS

| | | | |
|---|---|---|---|
| 6,306,672 B1 * | 10/2001 | Kim ................................ | 438/22 |
| 2004/0021147 A1 | 2/2004 | Ishibashi et al. | |
| 2010/0264440 A1 | 10/2010 | Park | |
| 2011/0272724 A1 * | 11/2011 | Tsai et al. ........................ | 257/98 |
| 2012/0049179 A1 * | 3/2012 | Kuo et al. ........................ | 257/43 |

FOREIGN PATENT DOCUMENTS

| | | |
|---|---|---|
| CN | 102386292 A | 3/2012 |
| CN | 102751405 A | 10/2012 |
| TW | 200403867 | 3/2004 |

* cited by examiner

*Primary Examiner* — Thao X Le
*Assistant Examiner* — Nduka Ojeh
(74) *Attorney, Agent, or Firm* — Novak Druce Connolly Bove + Quigg LLP

(57) ABSTRACT

An exemplary light emitting diode includes a substrate and a first undoped gallium nitride (GaN) layer formed on the substrate. The first undoped GaN layer defines a groove in an upper surface thereof. A distributed Bragg reflector is formed in the groove of the first undoped GaN layer. The distributed Bragg reflector includes a plurality of second undoped GaN layers and a plurality of air gaps alternately stacked one on the other. An n-type GaN layer, an active layer and a p-type GaN layer are formed on the distributed Bragg reflector and the first undoped GaN layer. A p-type electrode and an n-type electrode are electrically connected with the p-type GaN layer and the n-type GaN layer, respectively. A method for manufacturing plural such light emitting diodes is also provided.

9 Claims, 15 Drawing Sheets

LIGHT EMITTING DIODE AND METHOD FOR MANUFACTURING LIGHT EMITTING DIODES

BACKGROUND

1. Technical Field

The disclosure generally relates to a light emitting diode with a distributed Bragg reflector, and a method for manufacturing a plurality of such light emitting diodes.

2. Description of Related Art

In recent years, due to their excellent quality of output light and high luminous efficiency, light emitting diodes (LEDs) have increasingly been used as substitutes for incandescent bulbs, compact fluorescent lamps and fluorescent tubes as light sources of illumination devices.

A light emitting diode chip of an LED includes a substrate, and a buffer layer, an n-type semiconductor, an active layer and a p-type semiconductor formed on the substrate in that sequence. However, light transmitting from the active layer to the substrate is easily absorbed by the buffer layer and the substrate, thereby decreasing the light emitting efficiency of the light emitting diode chip. In order to prevent light from being absorbed by the substrate and the buffer layer, a distributed Bragg reflector is formed between the buffer layer and the n-type semiconductor to reflect light from the active layer. The distributed Bragg reflector generally includes two layers with different refractive indexes. However, when the difference between the refractive indexes of the two layers is small, light from the active layer can not be reflected by the distributed Bragg reflector efficiently.

What is needed, therefore, is a light emitting diode and a method for manufacturing the light emitting diode which can overcome the above-described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments of a light emitting diode and a method for manufacturing a plurality of the light emitting diodes will now be described in detail below and with reference to the drawings.

Figure 1:
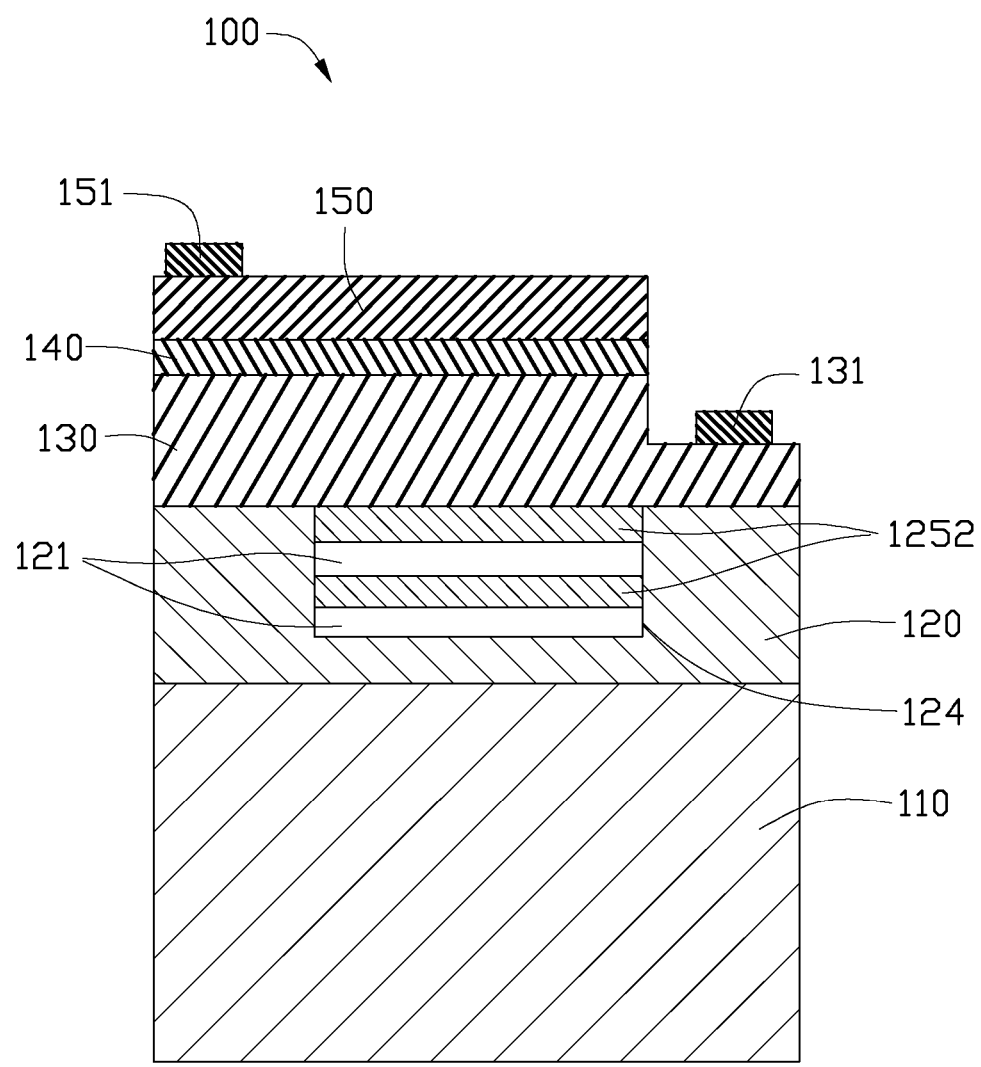
FIG. 1 is a cross-sectional view of a light emitting diode in accordance with an embodiment of the present disclosure.

Referring to FIG. 1, a light emitting diode 100 in accordance with an embodiment is provided. The light emitting diode 100 includes a substrate 110, a first undoped gallium nitride (GaN) layer 120 formed on the substrate 110, and an n-type GaN layer 130, an active layer 140 and a p-type GaN layer 150 formed on the first undoped GaN layer 120. A p-type electrode 151 and an n-type electrode 131 are electrically connected with the p-type GaN layer 150 and the n-type GaN layer 130, respectively.

The substrate 110 can be selected from a sapphire substrate, a silicon (Si) substrate and a silicon carbide (SiC) substrate. In this embodiment, the substrate 110 is a sapphire substrate. The active layer 140 can be a multiple quantum well (MQW) structure.

The first undoped GaN layer 120 defines a groove 124 in an upper surface thereof. A plurality of air gaps 121 and a plurality of second undoped GaN layers 1252 are located inside the groove 124, and cooperatively form a distributed Bragg reflector. The air gaps 121 and the second undoped GaN layers 1252 are alternately stacked one on the other. Each two second undoped GaN layers 1252 are spaced apart by a corresponding air gap 121. A bottommost one of the second undoped GaN layers 1252 is spaced from a portion of the first undoped GaN layer 120 below it by a corresponding air gap 121. Thus in the illustrated embodiment, the distributed Bragg reflector is made up of two second undoped GaN layers 1252 and two air gaps 121.

In this embodiment, a thickness D1 of each air gap 121 follows the formula $D1=\lambda/(4n_1)$, and a thickness D2 of each second undoped GaN layer 1252 follows the formula $D2=\lambda/(4n_2)$, wherein $\lambda$ represents a wavelength of light emitted by the active layer 140, $n_1$ represents a refractive index of air, and $n_2$ represents a refractive index of the second undoped GaN layer 1252. For example, when the active layer 140 emits light with a wavelength $\lambda$ of 365 nm (nanometers), and since air has a refractive index of about 1, and when the second undoped GaN layer 1252 has a refractive index of about 2.48, then the thickness D1 of each air gap 121 is about 91.2 nm, and the thickness D2 of each second undoped GaN layer 1252 is about 36.7 nm.

A reflection capability R of a distributed Bragg reflector can be calculated as follows:

$$R=[n_0(n_2)^{2N}-n_s(n_1)^{2N}]^2/[n_0(n_2)^{2N}+n_s(n_1)^{2N}]^2$$

In the formula, $n_0$, $n_1$, $n_2$ and $n_s$ represent the refractive indexes of the originating medium, the two alternating materials, and the terminating medium respectively, and N represents the number of repeated pairs of low/high refractive index materials.

That is, when the refractive indexes of the originating medium and the terminating medium are determined, the larger the difference between $n_1$ and $n_2$ is, the higher the reflection capability R is.

In the light emitting diode 100 described above, since the refractive index of air ($n_1$=1) is less than refractive indexes of semiconductor materials, the distributed Bragg reflector formed by the second undoped GaN layers 1252 and the air gaps 121 has a relatively high reflection capability for a given wavelength of light emitted by the active layer 140. Therefore, light transmitting from the active layer 140 to the substrate 110 is highly reflected by the distributed Bragg reflector formed by the second undoped GaN layers 1252 and the air gaps 121. Accordingly, a lighting efficiency of the light emitting diode 100 is improved. In addition, in order to obtain a predetermined reflection capability, when the difference between the refractive indexes $n_1$, $n_2$ of the two alternating materials is larger, the number of repeated pairs N is smaller. A traditional distributed Bragg reflector needs 15~30 pairs of low/high refractive index materials to achieve a high reflection capability. In the light emitting diode 100 described above, since the distributed Bragg reflector is formed by the second undoped GaN layers 1252 and the air gaps 121, only 2~3 pairs of low/high refractive index materials are needed to achieve a high reflection capability. Therefore, the light emitting diode 100 can have a simple manufacturing process and a low cost.

Figure 2:
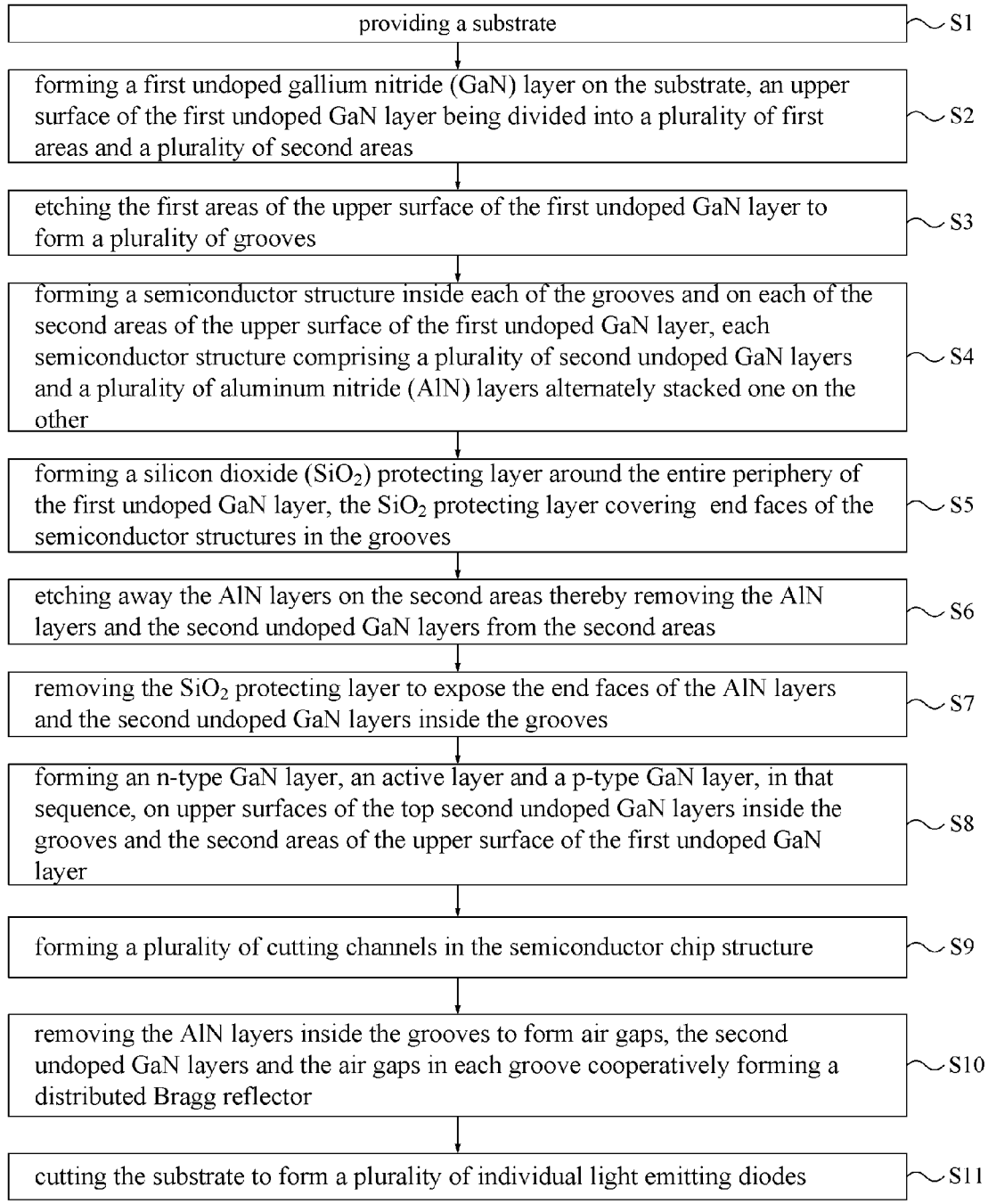
FIG. 2 is a flowchart showing steps of an exemplary method for manufacturing a plurality of the light emitting diodes of FIG. 1.

Referring to FIG. 2, an exemplary method for manufacturing a plurality of the light emitting diodes 100 includes the following steps S1-S11.

Figure 3:
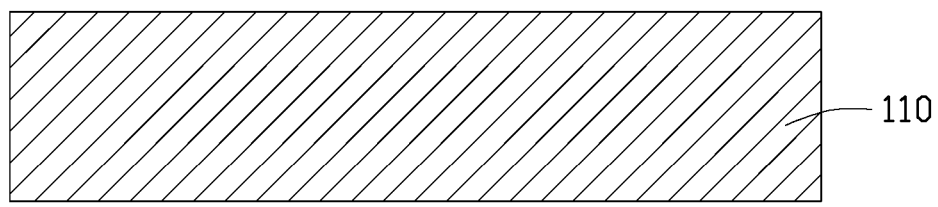
FIG. 3 is a cross-sectional view showing a first step of the method of FIG. 2, wherein a substrate of the light emitting diodes is provided.

Step S1: Referring to FIG. 3, a substrate 110 is provided. The substrate 110 can be a sapphire substrate, a Si substrate or a SiC substrate.

Figure 4:
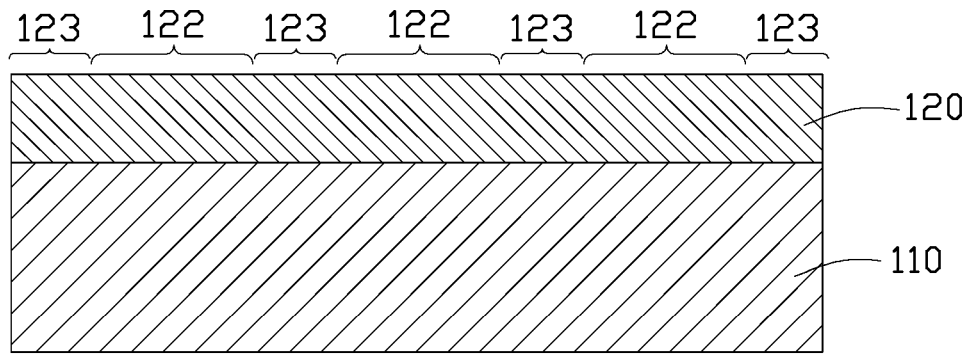
FIG. 4 is a cross-sectional view showing a second step of the method of FIG. 2, wherein a semiconductor chip structure is obtained.
Figure 5:
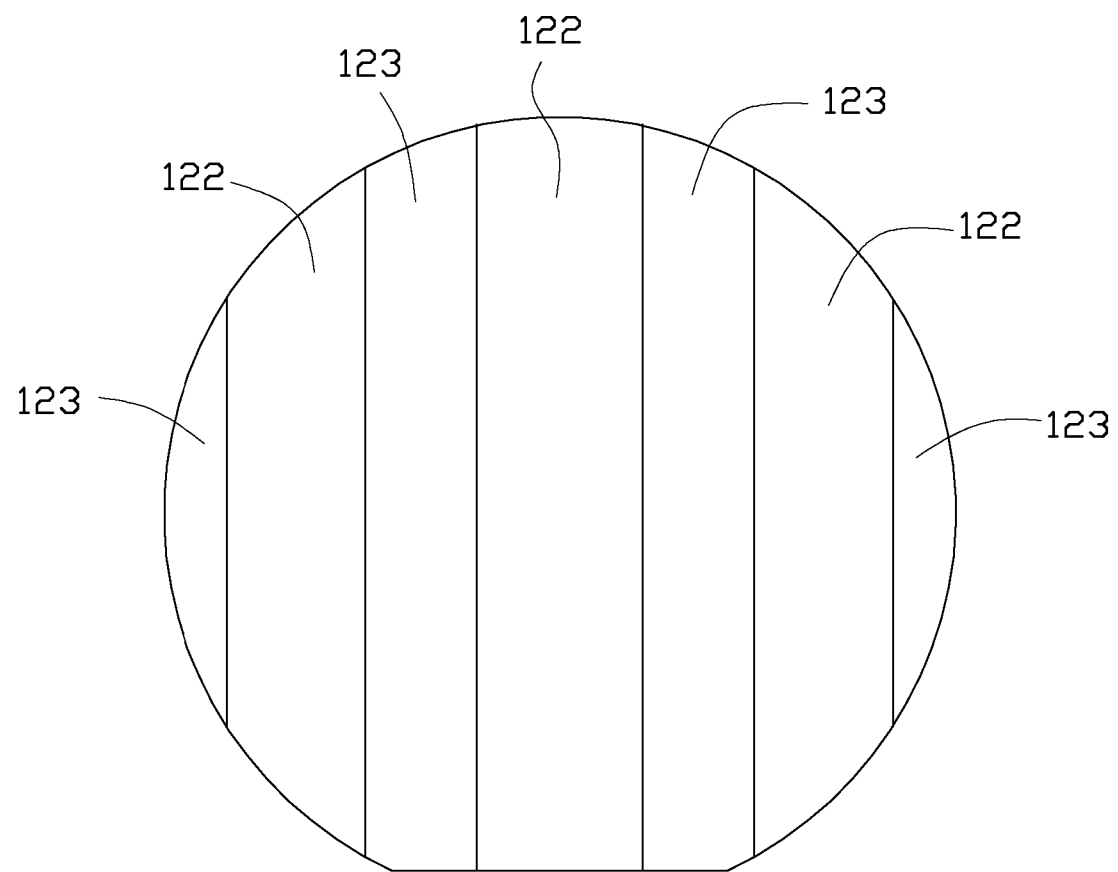
FIG. 5 is a top plan view of the semiconductor chip structure obtained according to FIG. 4.

Step S2: Referring to FIG. 4, a first undoped GaN layer 120 is formed on a top surface of the substrate 110. An upper surface of the first undoped GaN layer 120 is divided into a plurality of first areas 122 and a plurality of second areas 123. The first areas 122 and the second areas 123 are alternately arranged side by side on the upper surface of the first undoped GaN layer 120. Referring also to FIG. 5, in this embodiment, the first areas 122 and the second areas 123 are strip-shaped, and occupy an entirety of the upper surface of the first undoped GaN layer 120. The structure illustrated in FIGS. 4-5 can be considered to be a semiconductor chip structure.

Figure 6:
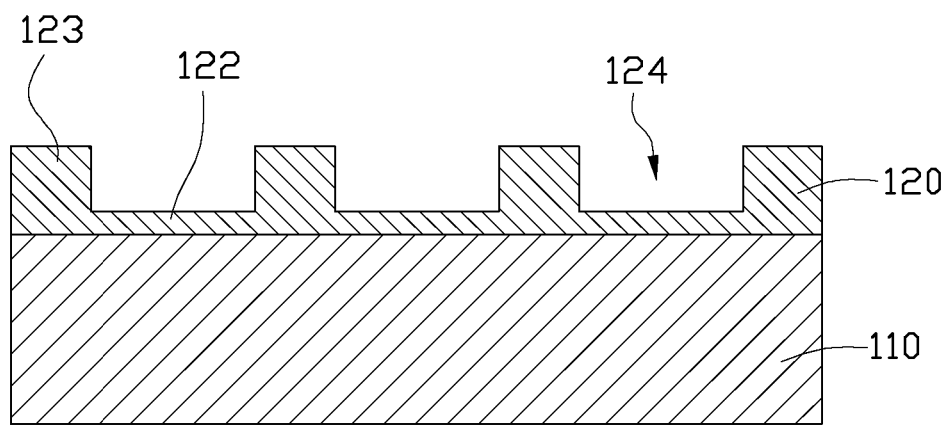
FIG. 6 is a cross-sectional view showing a third step of the method of FIG. 2.

Step S3: Referring to FIG. 6, the first areas 122 of the upper surface of the first undoped GaN layer 120 are etched to form a plurality of grooves 124. In this embodiment, the grooves 124 are formed by plasma etching. A depth of the grooves 124 is determined by a required number of repeated pairs of aluminum nitride (AlN) layers 1251 (see FIG. 7) and second undoped GaN layers 1252. The grooves 124 should have a depth sufficient to receive at least one pair of an AlN layer 1251 and a second undoped GaN layer 1252.

Figure 7:
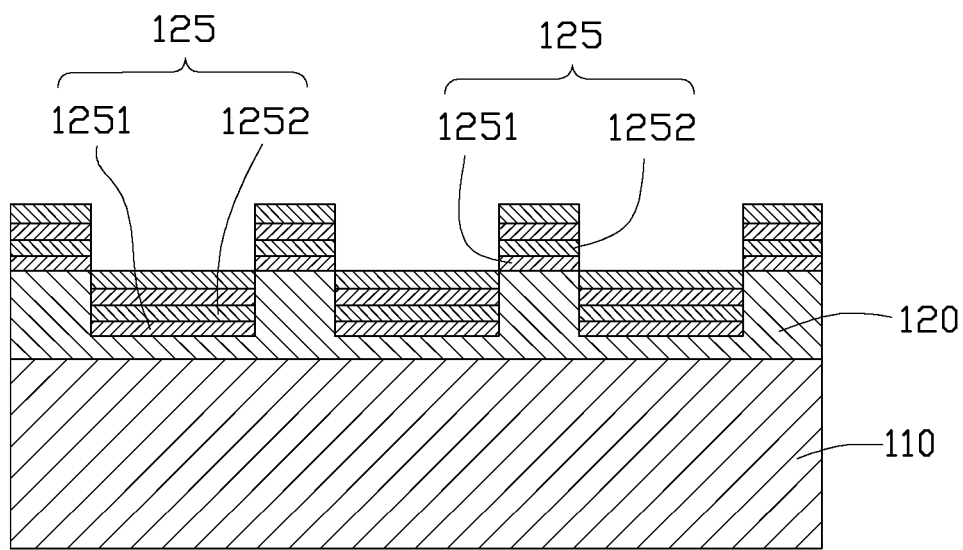
FIG. 7 is a cross-sectional view showing a fourth step of the method of FIG. 2.

Step S4: Referring to FIG. 7, a plurality of semiconductor structures 125 is formed inside the grooves 124 and on the upper surfaces of the second areas 123. In this embodiment, each semiconductor structure 125 includes a plurality of AlN layers 1251 and a plurality of second undoped GaN layers 1252 alternately stacked one on the other. One of the AlN layers 1251 constitutes the bottom side of the semiconductor structure 125. One of the second undoped GaN layers 1252 constitutes the top side of the semiconductor structure 125. In the illustrated embodiment, the semiconductor structure 125 includes two pairs of an AlN layer 1251 and a second undoped GaN layer 1252. In alternative embodiments, the semiconductor structure 125 can include one pair of an AlN layer 1251 and a second undoped GaN layer 1252, or at least three pairs of an AlN layer 1251 and a second undoped GaN layer 1252.

Figure 8:
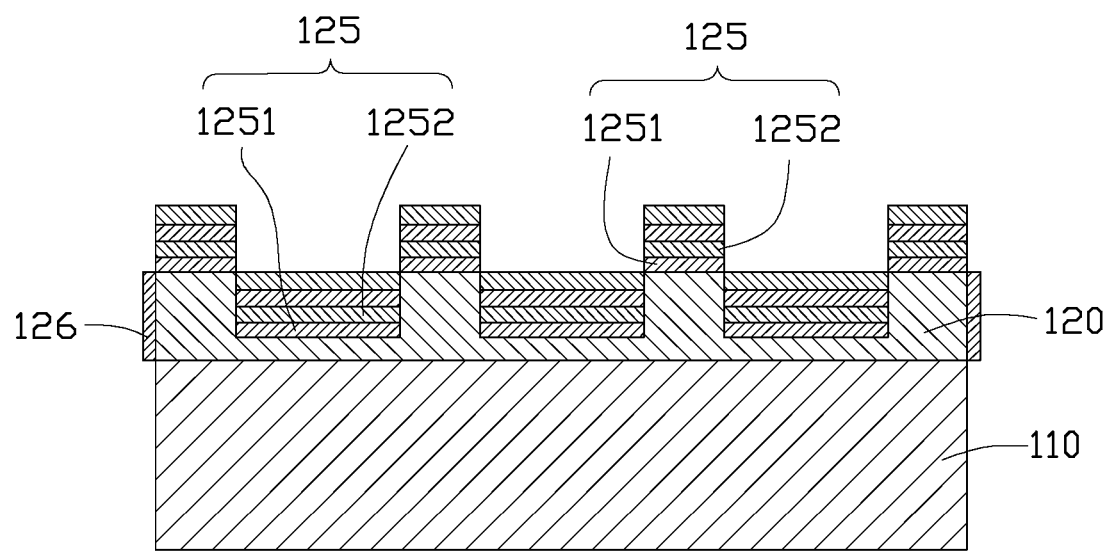
FIG. 8 is a cross-sectional view showing a fifth step of the method of FIG. 2, wherein a modification of the semiconductor chip structure is obtained.
Figure 9:
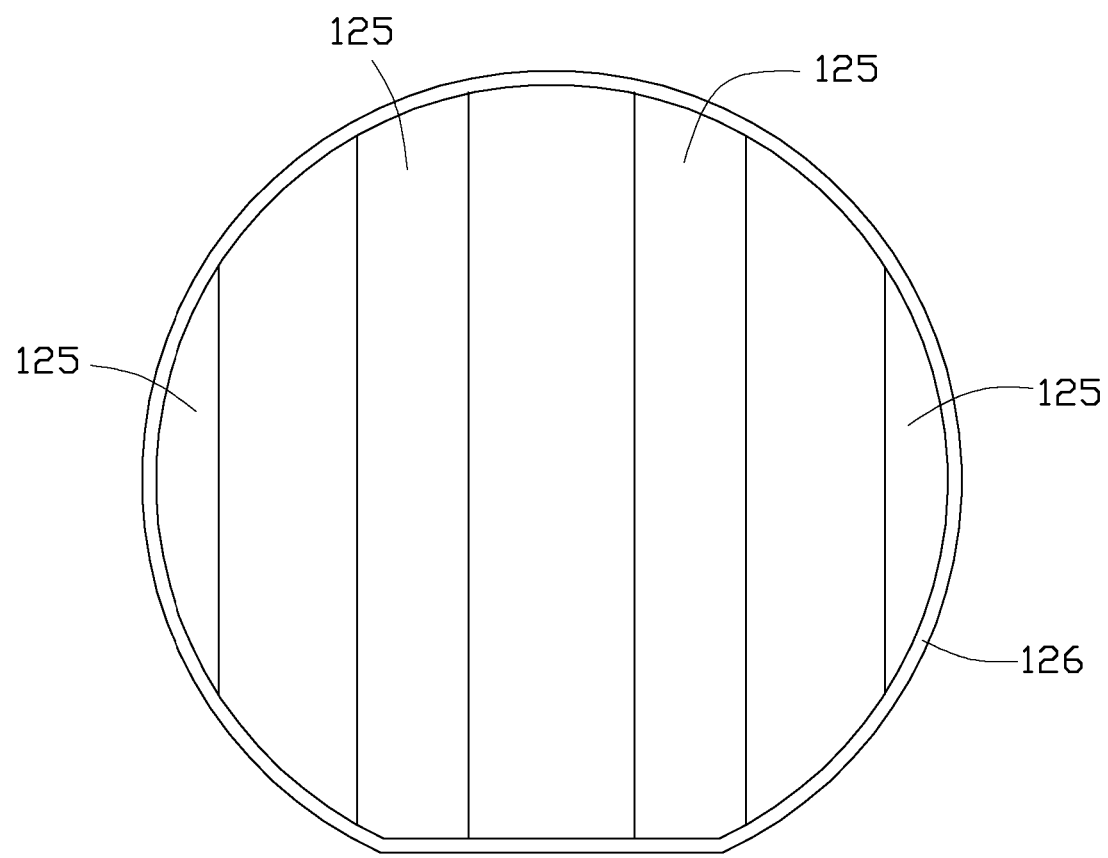
FIG. 9 is a top plan view of the modified semiconductor chip structure obtained according to FIG. 8.

Step S5: Referring to FIGS. 8-9, a circumferential silicon dioxide ($SiO_2$) protecting layer 126 is formed around the entire periphery of the first undoped GaN layer 120. The $SiO_2$ protecting layer 126 covers side surfaces of the first undoped GaN layer 120, and end faces of the semiconductor structures 125 in the grooves 124. That is, the $SiO_2$ protecting layer 126 surrounds the first undoped GaN layer 120 including the end faces of the semiconductor structures 125 in the grooves 124. In this embodiment, the $SiO_2$ protecting layer 126 has a thickness of about 300 nm.

Figure 10:
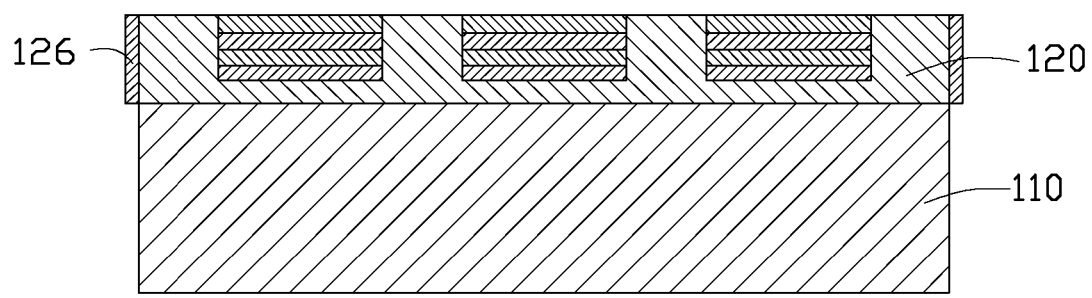
FIG. 10 is a cross-sectional view showing a sixth step of the method of FIG. 2.

Steps S6: Referring to FIG. 10, the AlN layers 1251 and the second undoped GaN layers 1252 on the second areas 123 are removed from the first undoped GaN layer 120. In removing the AlN layers 1251 and the second undoped GaN layers 1252, the semiconductor chip structure having the $SiO_2$ protecting layer 126 is dipped into a hot potassium hydroxide (KOH) solution. Preferably, the KOH solution is heated to a temperature in the range of from about 70 degrees Centigrade to about 90 degrees Centigrade. Since an etching speed of the KOH solution with respect to any AlN layer 1251 is much higher than an etching speed of the KOH solution with respect to any second undoped GaN layer 1252, the AlN layers 1251 on the second areas 123 not covered by the $SiO_2$ protecting layer 126 are firstly etched away. As a result, the second undoped GaN layers 1252 on the second areas 123 are separated from the first undoped GaN layer 120. As regards the semiconductor structures 125 inside the grooves 124, the ends of the semiconductor structures 125 are surrounded by the protecting layer 126, and the tops of the semiconductor structures 125 are constituted by the top second undoped GaN layers 1252 thereof. Accordingly, the KOH solution can not permeate into the semiconductor structures 125 inside the grooves 124 to etch away the AlN layers 1251 thereof.

Figure 11:
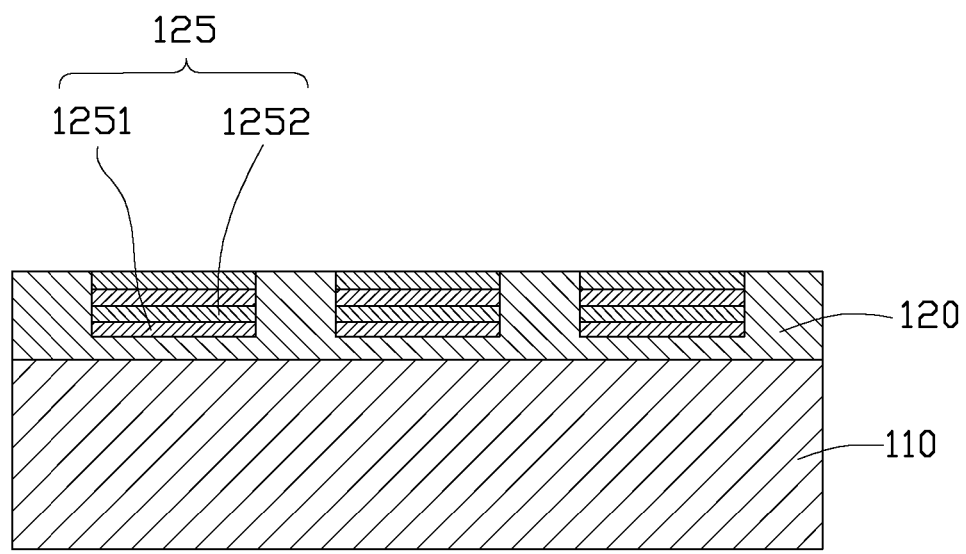
FIG. 11 is a cross-sectional view showing a seventh step of the method of FIG. 2.

Step S7: Referring to FIG. 11, after the semiconductor structures 125 on the second areas 123 are removed, the $SiO_2$ protecting layer 126 is removed to expose the end faces of the AlN layers 1251 and the second undoped GaN layers 1252 inside the grooves 124.

Figure 12:
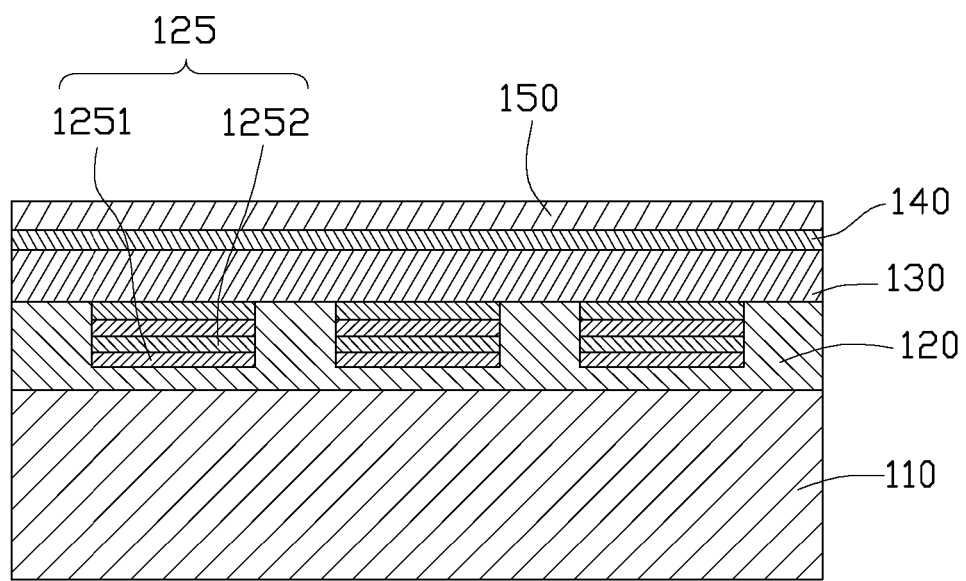
FIG. 12 is a cross-sectional view showing an eighth step of the method of FIG. 2.

Step S8: Referring to FIG. 12, an n-type GaN layer 130, an active layer 140 and a p-type GaN layer 150 are formed, in that sequence, on the upper surface of the first undoped GaN layer 120 and upper surfaces of the top second undoped GaN layers 1252. In this embodiment, the active layer 140 is a multiple quantum well (MQW) structure.

Figure 13:
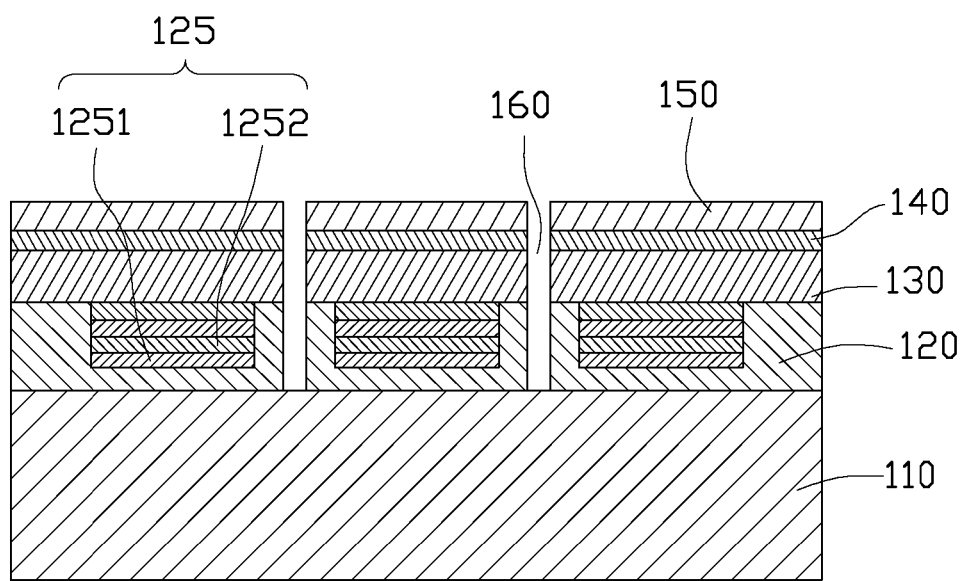
FIG. 13 is a cross-sectional view showing a ninth step of the method of FIG. 2.

Step S9: Referring to FIG. 13, a plurality of cutting channels 160 are formed in the semiconductor chip structure obtained above. The cutting channels 160 are arranged in the form of a grid. Each cutting channel 160 extends down from the p-type GaN layer 150 to the first undoped GaN layer 120 and terminates at the top surface of the substrate 110. The cutting channels 160 expose end surfaces of the AlN layers 1251 inside the grooves 124.

Figure 14:
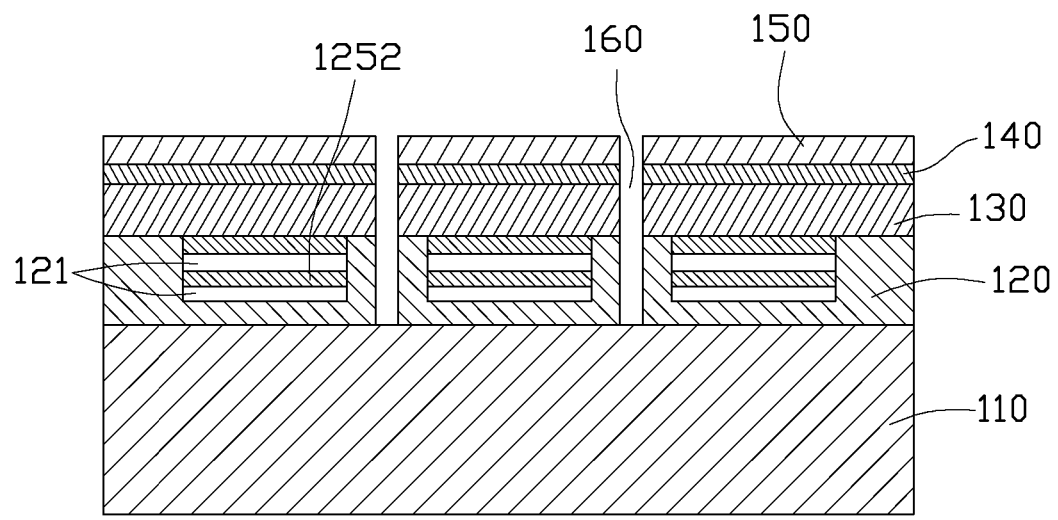
FIG. 14 is a cross-sectional view showing a tenth step of the method of FIG. 2.

Step S10: Referring to FIG. 14, the AlN layers 1251 inside the grooves 124 are removed to form air gaps 121. In each groove 124, the air gaps 121 and the corresponding second undoped GaN layers 1252 stacked thereon cooperatively form a distributed Bragg reflector. In this embodiment, the AlN layers 1251 inside the grooves 124 are etched away by a hot KOH solution. The KOH solution is heated to a temperature in the range of from about 70 degrees Centigrade to about 90 degrees Centigrade. In this embodiment, a thickness D1 of each air gap 121 follows the formula $D1=\lambda/(4n_1)$, and a thickness D2 of each second undoped GaN layer 1252 follows the formula $D2=\lambda/(4n_2)$, wherein $\lambda$ represents a wavelength of light emitted by the active layer 140, $n_1$ represents a refractive index of air, and $n_2$ represents a refractive index of the second undoped GaN layer 1252.

Step S11: Then the semiconductor chip structure obtained above is cut along the cutting channels 160 to form a plurality of light emitting diodes 100. An n-type electrode 131 and a p-type electrode 151 are respectively formed on the n-type GaN layer 130 and the p-type GaN layer 150 of each light emitting diode 100.

In another embodiment, the semiconductor chip structure in FIG. 12 can be directly dipped into the hot KOH solution, without the need for forming the cutting channels 160.

Figure 15:
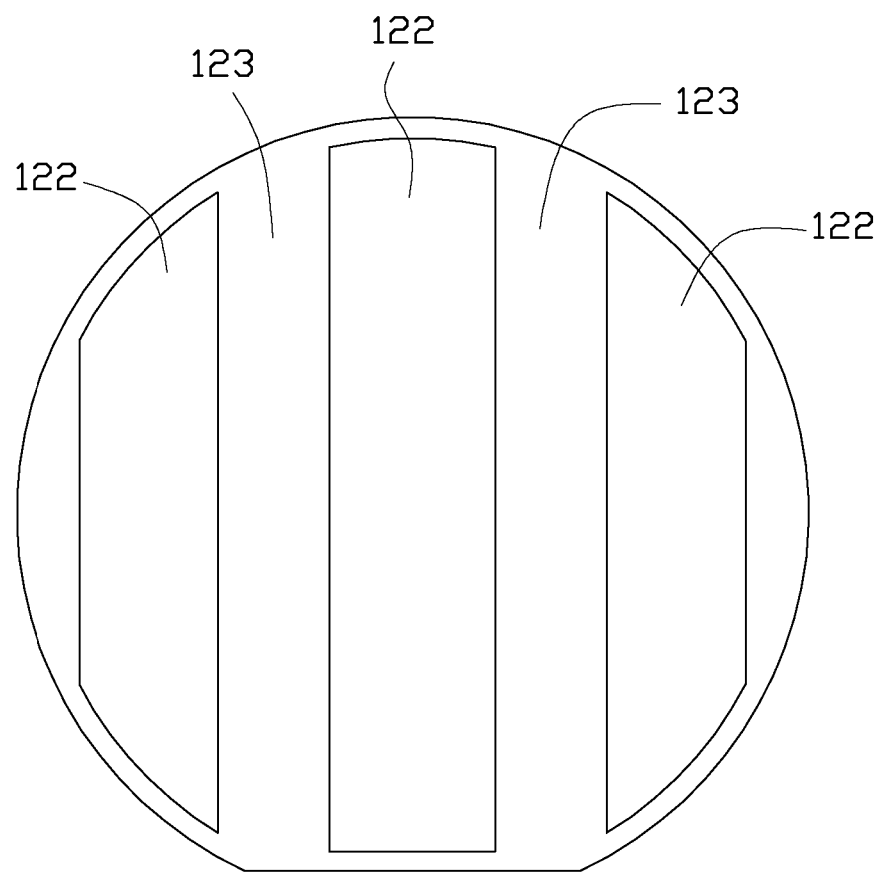
FIG. 15 is similar to FIG. 5, but shows a top plan view of a semiconductor chip structure obtained in accordance with another embodiment of the method for manufacturing a plurality of the light emitting diodes.

In still another embodiment, when the first areas 122 are defined on the upper surface of the first undoped GaN layer 120, ends of the first areas 122 do not extend to the periphery of the first undoped GaN layer 120, as shown in FIG. 15. Thus, the grooves 124 are located totally inside the first undoped GaN layer 120. After the semiconductor structures 125 are formed inside the grooves 124, the AlN layers 1251 inside the grooves 124 are covered by the corresponding top second undoped GaN layers 1252. Therefore, in order to remove the AlN layers 1251 on the second areas 123, it is not necessary to form the SiO$_2$ protecting layer 126, because the AlN layers 1251 inside the grooves 124 are already protected from being etched by the first undoped GaN layer 120 and the top second undoped GaN layers 1252.

In the manufacturing method described above, the AlN layers 1251 can be replaced by n-type GaN layers. The n-type GaN layers have an ion doping concentration in the range of from about $8*10^{18}$ cm$^{-3}$ to about $1*10^{20}$ cm$^{-3}$. In such embodiment, the n-type GaN layers are removed by a photochemical etching method using a KOH solution to form the air gaps 121.

It is to be further understood that even though numerous characteristics and advantages of the present embodiments have been set forth in the foregoing description, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a plurality of light emitting diodes, the method comprising:
   providing a substrate;
   forming a first undoped gallium nitride (GaN) layer on the substrate, an upper surface of the first undoped GaN layer being divided into a plurality of first areas and a plurality of second areas;
   etching the first areas of the upper surface of the first undoped GaN layer to form a plurality of grooves;
   forming a semiconductor structure inside each of the grooves and on each of the second areas of the upper surface of the first undoped GaN layer, each semiconductor structure comprising a plurality of second undoped GaN layers and a plurality of aluminum nitride (AlN) layers alternately stacked one on the other, a topmost one of the second undoped GaN layers being located at a top side of the semiconductor structure, and a bottommost one of the AlN layers being located at a bottom side of the semiconductor structure;
   etching away the AlN layers on the second areas thereby removing the AlN layers and the second undoped GaN layers from the second areas;
   forming an n-type GaN layer, an active layer and a p-type GaN layer, in that sequence, on upper surfaces of the topmost second undoped GaN layers and the second areas of the upper surface of the first undoped GaN layer;
   removing the AlN layers inside the grooves to form air gaps, the second undoped GaN layers and the air gaps in each groove cooperatively forming a distributed Bragg reflector; and
   cutting the substrate to form a plurality of individual light emitting diodes.

2. The method of claim 1, further comprising, before etching away the AlN layers on the second areas, forming a silicon dioxide (SiO2) protecting layer around the entire periphery of the first undoped GaN layer, wherein the SiO2 protecting layer covers side surfaces of the first undoped GaN layer and end faces of the semiconductor structures in the grooves in order to prevent the AlN layers inside the grooves from being etched when the AlN layers on the second areas are etched away.

3. The method of claim 2, further comprising removing the SiO2 protecting layer after etching away the AlN layers on the second areas.

4. The method of claim 2, wherein the SiO2 protecting layer has a thickness of about 300 nanometers (nm).

5. The method of claim 2, wherein the AlN layers on the second areas are etched away by using a potassium hydroxide (KOH) solution.

6. The method of claim 2, further comprising, before removing the AlN layers inside the grooves, forming a plurality of cutting channels, wherein each cutting channel extends from the p-type GaN layer to the first undoped GaN layer to expose end surfaces of the AlN layers inside the grooves, and the cutting channels are arranged in the form of a grid.

7. The method of claim 6, further comprising cutting the substrate along the cutting channels to form the plurality of individual light emitting diodes.

8. The method of claim 1, wherein a thickness D1 of each air gap follows the formula $D1=\lambda/(4n1)$, a thickness D2 of each second undoped GaN layer follows the formula $D2=\lambda/(4n2)$, $\lambda$ represents a wavelength of light emitted by the active layer, n1 represents a refractive index of air, and n2 represents a refractive index of the second undoped GaN layer.

9. The method of claim 1, wherein the grooves formed by etching the first areas are totally inside the first undoped GaN layer.

* * * * *